United States Patent
Tsukaguchi et al.

(10) Patent No.: US 6,858,151 B2
(45) Date of Patent: Feb. 22, 2005

(54) METAL/CERAMIC BONDING ARTICLE AND METHOD FOR PRODUCING SAME

(75) Inventors: Nobuyoshi Tsukaguchi, Nagano (JP); Takayuki Takahashi, Nagano (JP); Yukihiro Kitamura, Nagano (JP); Masami Kimura, Chiba (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

(21) Appl. No.: 10/254,686

(22) Filed: Sep. 25, 2002

(65) Prior Publication Data

US 2003/0232204 A1 Dec. 18, 2003

(30) Foreign Application Priority Data

Jun. 14, 2002 (JP) .................................... P2002-173922

(51) Int. Cl.[7] .......................................... H01L 21/302
(52) U.S. Cl. ............................ 216/13; 216/16; 216/20; 216/100; 216/105; 29/831; 29/846; 29/847
(58) Field of Search ............................. 216/13, 16, 20, 216/100, 105; 29/831, 846, 847

(56) References Cited

U.S. PATENT DOCUMENTS

| | | | | |
|---|---|---|---|---|
| 3,766,634 A | * | 10/1973 | Babcock et al. | ............ 228/188 |
| 3,993,411 A | * | 11/1976 | Babcock et al. | ............ 403/271 |
| 3,994,430 A | * | 11/1976 | Cusano et al. | ........... 228/122.1 |
| 4,409,278 A | * | 10/1983 | Jochym | ...................... 428/163 |
| 4,413,766 A | * | 11/1983 | Webster | ................... 228/122.1 |
| 4,505,418 A | * | 3/1985 | Neidig et al. | ............ 228/122.1 |
| 4,631,099 A | | 12/1986 | Ebata et al. | |
| 4,806,725 A | * | 2/1989 | Narizuka et al. | ........... 347/203 |
| 5,019,222 A | * | 5/1991 | Hino et al. | ................. 205/152 |
| 6,054,762 A | * | 4/2000 | Sakuraba et al. | ........... 257/703 |
| 6,182,358 B1 | * | 2/2001 | Schulz-Harder | ............. 29/846 |
| 2003/0066865 A1 | * | 4/2003 | Tsukaguchi et al. | ..... 228/122.1 |
| 2003/0068532 A1 | * | 4/2003 | Tsukaguchi et al. | ........ 428/698 |
| 2003/0068537 A1 | * | 4/2003 | Tsukaguchi et al. | ........ 428/901 |

FOREIGN PATENT DOCUMENTS

| | | | | |
|---|---|---|---|---|
| EP | 1 298 109 | 4/2003 | | |
| GB | 2 059 323 | 4/1981 | | |
| JP | 11-097203 A | * | 4/1999 | ............ H01C/3/00 |

OTHER PUBLICATIONS

Arata, Y. et al "Studies on Solid State Reaction Bonding of Metal and Ceramic (Report I)—Bonding of Al–Mg alloy to ZrO2 ceramic" Transactions of JWRI, 1984, vol. 13, No. 1, pp 41–46.*

Grant, Julius, ed. "Hackh's Chemcial Dictionary" 1969, McGraw–Hill Book Co., 4th edition, pp 175 and 406.*

Japanese Patent Laid–Open No. 11–97203 (published on Apr. 9, 1999). Attached is a copy of the abstract.

* cited by examiner

*Primary Examiner*—Anita Alanko
(74) *Attorney, Agent, or Firm*—Bachman & LaPointe, P.C.

(57) ABSTRACT

There is provided a method for producing a metal/ceramic bonding article, the method including the steps of: bonding a metal plate 12 of an alloy containing copper and nickel directly to at least one side of a ceramic substrate 10; applying a resist 14 on a predetermined portion of the metal plate 12 to remove an undesired portion of the metal plate 12 by etching; and removing the resist 14 to form a pattern having a predetermined shape of the alloy on the ceramic substrate 10. According to this method, it is possible to reduce the displacement failure of parts to improve productivity and to prevent bonding failure during the mounting of a semiconductor device or the like thereon.

6 Claims, 4 Drawing Sheets

METAL/CERAMIC BONDING ARTICLE AND METHOD FOR PRODUCING SAME

BACKGROUND OF THE INVENTION

1. Field of the Invention

The present invention generally relates to a metal/ceramic bonding article having a ceramic substrate and a metal plate bonded to the ceramic substrate, and a method for producing the same. More specifically, the invention relates to a metal/ceramic bonding article wherein a metal plate of a Cu—Ni or Cu—Mn—Ni alloy serving as a resistive element is bonded to a ceramic substrate and which is used for an electronic member for resistance, such as a shunt resistive element, and a method for producing the same.

2. Description of the Prior Art

In conventional electronic members for resistance, such as shunt resistive elements, an alloy plate serving as a sheet resistor precisely worked by a press working or the like is bonded to a ceramic substrate via a brazing filler metal, such as an Ag brazing filler, by means of the brazing and soldering (see Japanese Patent Laid-Open No. 11-97203).

However, in such an electronic member bonded via a brazing filler metal, a worked sheet resistor must be arranged on a ceramic substrate at a precise position to be bonded thereto. In particular, when a very small resistor having a size of 10 mm□, such as a hunt resistive element, is bonded to a ceramic substrate, the displacement of the resistor is easy to occur, and it is difficult to bond one or a plurality of resistors to one ceramic substrate, so that there is a problem in that the displacement failure of the resistor is not only caused, but productivity also considerably deteriorates.

In addition, since the alloy plate serving as the resistor has a low solder wettability, there is a problem in that there are some cases where bonding failure may occur when a semiconductor device or the like is mounted on the alloy plate.

SUMMARY OF THE INVENTION

It is therefore an object of the present invention to eliminate the aforementioned problems and to provide a metal/ceramic bonding article capable of reducing the displacement failure of parts to improve productivity, and a method for producing the same.

It is another object of the present invention to provide a metal/ceramic bonding article capable of preventing bonding failure when a semiconductor device or the like is mounted thereon.

In order to accomplish the aforementioned and other objects, the inventors have diligently studied and found that it is possible to reduce the displacement failure of a pattern to improve productivity by bonding a metal plate of an alloy containing copper and nickel to a ceramic substrate, applying a resist on a predetermined portion of the metal plate, removing an undesired portion of the metal plate by etching, and removing the resist to form a pattern having a predetermined shape. As a result, the inventors have made the present invention.

According to one aspect of the present invention, there is provided a method for producing a metal/ceramic bonding article, the method comprising the steps of: bonding a metal plate of an alloy containing copper and nickel directly to at least one side of a ceramic substrate; applying a resist on a predetermined portion of the metal plate to remove an undesired portion of the metal plate by etching; and removing the resist to form a pattern having a predetermined shape of the alloy on the ceramic substrate.

In this metal/ceramic bonding article producing method, the alloy preferably contains manganese. The metal plate is preferably made of an electric resistance material. The etching is preferably carried out by using an etchant containing copper chloride or iron chloride. In addition, a plating is preferably carried out on the entire surface or part of the metal plate. The plating is preferably Ni plating, Ni alloy plating or Au plating.

According to another aspect of the present invention, a metal/ceramic bonding article comprises: a ceramic substrate; and a metal plate bonded directly to at least one side of the ceramic substrate, the metal plate being made of an alloy containing copper and nickel, and the metal plate being formed so as to have a pattern having a predetermined shape.

In this metal/ceramic bonding article, the alloy preferably contains manganese. The metal plate preferably has a peel strength of 10 N/cm or more. The metal/ceramic bonding article preferably has an insulation resistance of higher than 1000 MΩ. In addition, a plating is preferably carried out on the entire surface or part of the metal plate. The plating is preferably Ni plating, Ni alloy plating or Au plating.

According to a further aspect of the present invention, there is provided an electronic member for resistance, which comprises anyone of the above described metal/ceramic bonding articles.

According to a still further aspect of the present invention, there is provided a module assembled by using any one of the above described metal/ceramic bonding articles.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of a metal/ceramic bonding article and a method for producing the same according to the present invention will be described below.

Figure 1A:
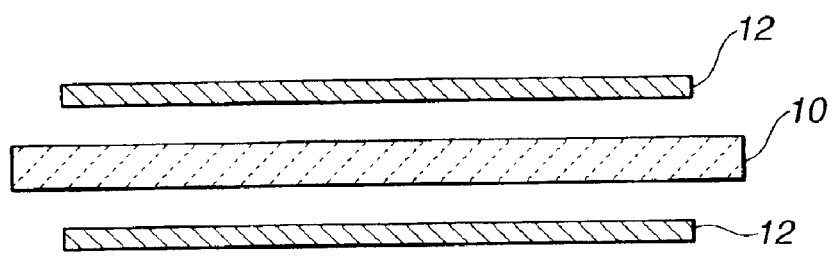
FIGS. 1A and 1B are sectional views showing producing steps in a preferred embodiment of a method for producing a metal/ceramic bonding article according to the present invention.
Figure 1B:
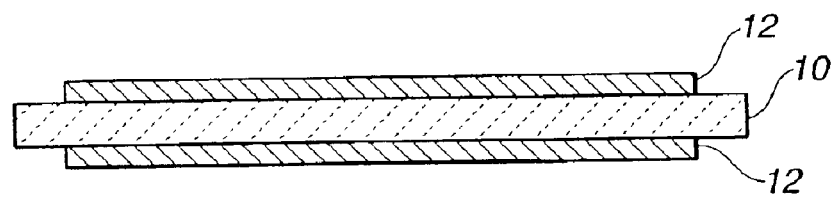

First, as shown in FIGS. 1A and 1B, metal plates 12 of a Cu—Ni or Cu—Ni—Mn alloy (manganin or the like) serving as an alloy for resistance are bonded directly to both sides (or one side) of a ceramic substrate 10, such as an alumina substrate, to obtain a metal/ceramic bonding article. If the metal plates 12 are bonded directly to the ceramic substrate 10, there is an advantage in that the values of resistance of the metal plates are constant before and after bonding since no brazing filler metal is used. The expression "bonded directly" means a method for bonding a metal plate to a ceramic plate without the need of any brazing filler metal. By such a method, a metal plate of an overall-rate solid solution type alloy, such as a Cu—Ni or Cu—Ni—Mn alloy, can be bonded to a ceramic plate in an atmosphere of an inert gas, such as $N_2$ gas, or in vacuo at a temperature approximating the melting point of the alloy. Furthermore, the metal plate 12 of a Cu—Ni or Cu—Ni—Mn alloy (manganin or the like) serving as an alloy for resistance may be bonded to one side of the ceramic substrate 10, and another metal plate, such as a copper plate, serving as a radiating metal plate may be bonded to the other side of the ceramic substrate 10. As the bonding strength of the metal plate, a peel strength of 10 N/cm or more is enough.

Figure 2A:
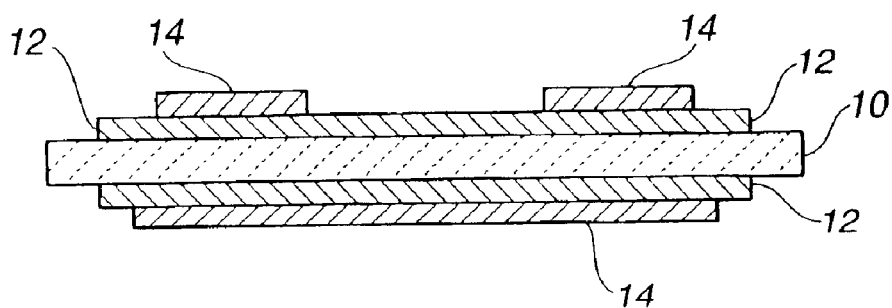
FIGS. 2A through 2C are sectional views showing producing steps in a preferred embodiment of a method for producing a metal/ceramic bonding article according to the present invention.
Figure 2B:
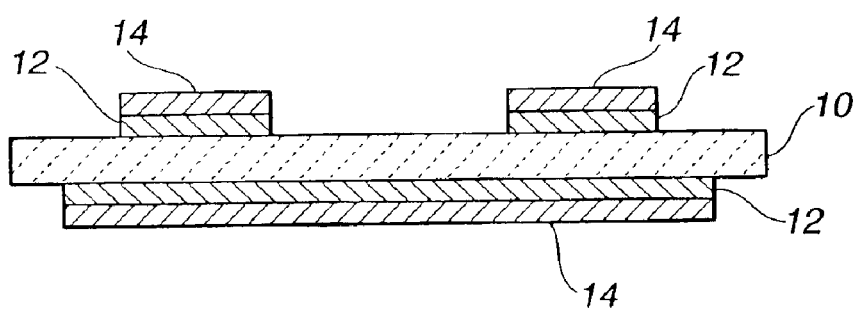
Figure 2C:
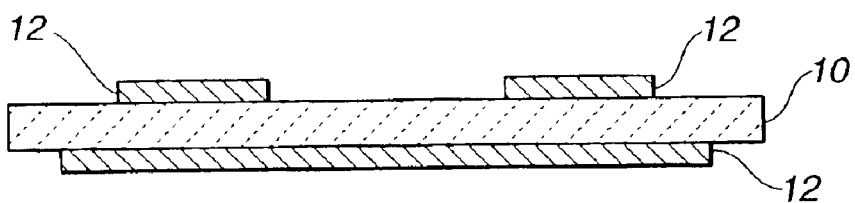

Then, a resist 14 is printed on predetermined portions of the metal plates 12 (FIG. 2A), and undesired portions of the metal plates 12 are removed by etching (FIG. 2B). Thereafter, the resist 14 is removed to form a metal circuit (a resistor circuit) on the ceramic substrate 10 (FIG. 2C).

As chemicals used for this etching, an etchant containing copper chloride or iron chloride is preferably used. By using such an etchant, some copper or iron alloys may share etching lines. In addition, even if a copper plate serving as a resistor is bonded to the other side of the ceramic substrate 10 opposite to the metal plate 12, the same chemicals can simultaneously etch the copper plate and the metal plate 12. Moreover, if an etchant containing copper chloride or iron chloride is used for etching, it is possible to ensure a resistance of at least 100 MΩ (DC 1000 V) or more between patterns of alloys or between one side and the other side. Furthermore, although this etching may be carried out by dipping, the showering of chemicals to a member to be etched is effective in view of the etch rate.

Then, as shown in FIGS. 3 and 4A through 4C, Ni—P plating, Ni—B plating or Au plating is carried out on the entire surface or part of the metal circuit formed on the ceramic substrate 10.

Figure 3:
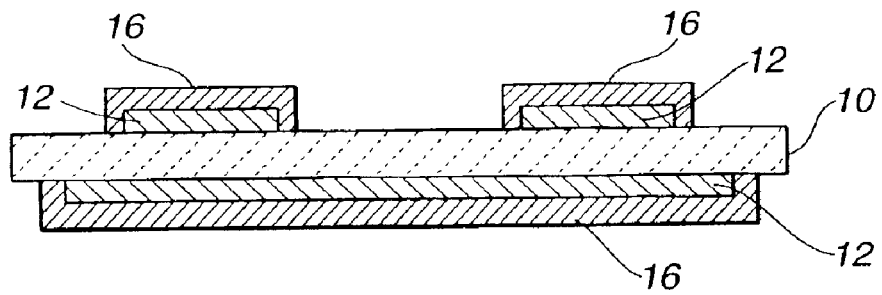
FIG. 3 is a sectional view showing a producing step in a preferred embodiment of a method for producing a metal/ceramic bonding article according to the present invention.

When the plating is carried out on the entire surface of the metal circuit, for example, predetermined chemicals are used for carrying out a plating 16, such as the electroless Ni—P plating, on the entire surface of the metal plates 12 after predetermined chemicals are used for carrying out processes, such as degreasing, chemical polishing, acid pickling and catalyst application (FIG. 3). By thus carrying out the plating on the entire surface of the metal circuit, it is possible to improve the WB characteristic and solder wettability, to prevent the deterioration of resistance with age due to the diffusion of the solder, and to prevent the deterioration of resistance with age due to the oxidation of the metal circuit of the alloy serving as the resistor.

Figure 4A:
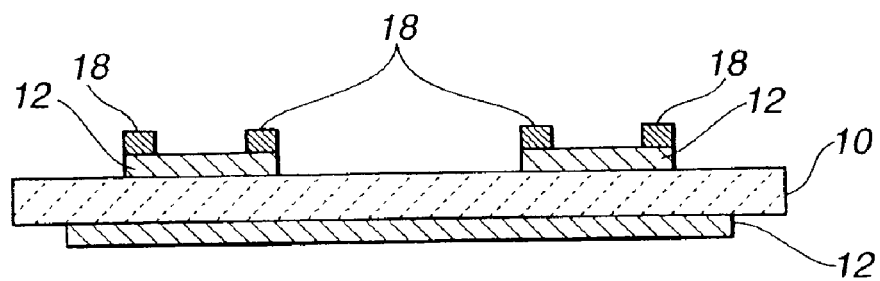
FIGS. 4A through 4C are sectional views showing producing steps in a preferred embodiment of a method for producing a metal/ceramic bonding article according to the present invention.
Figure 4B:
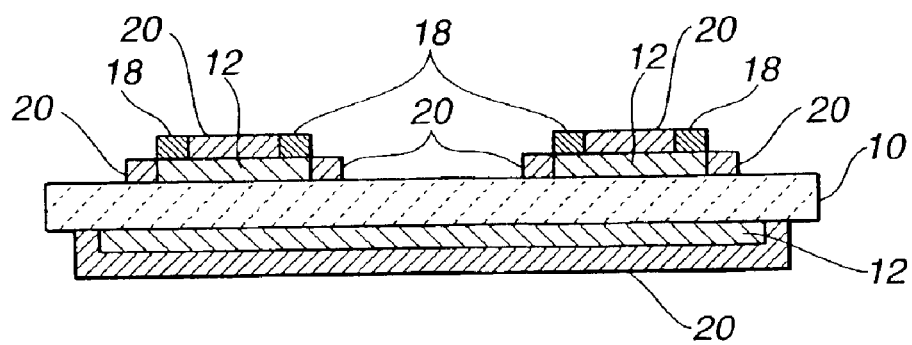
Figure 4C:
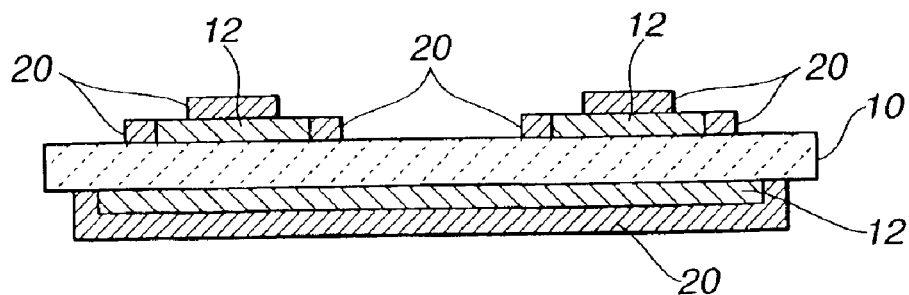

On the other hand, when the plating is carried out on a part of the metal circuit, for example, resists 18 are printed on predetermined portions of the metal plates 12 (FIG. 4A). Then, predetermined chemicals are used for carrying out processes, such as degreasing, chemical polishing, acid pickling and catalyst application, and predetermined chemicals are used for carrying out a plating 20, such as the electroless Ni—P plating, in portions other than the resists 18 on the metal plates 12 (FIG. 4B). Thereafter, the resists 18 are peeled off (FIG. 4C). By thus carrying out the plating on part of the metal circuit, it is possible to prevent the displacement of a semiconductor device when the semiconductor device is mounted, and it is possible to prevent the variation in value of resistance of the metal circuit serving as a resistive element, due to the flow of the solder and the reaction of the solder with the metal plate.

Examples of metal/ceramic bonding articles and methods for producing the same according to the present invention will be described below in detail.

EXAMPLE 1

Plates of a Cu—Ni—Mn alloy (manganin) having a size of 56×75 mm☐ and a thickness of 0.2 mm and serving as a resistive alloy were arranged directly on both sides of an alumina substrate having a size of 60×80 mm☐ and a thickness of 0.635 mm to be heated in an atmosphere of nitrogen to a maximum temperature of 975° C. to obtain a metal/ceramic bonding article. Then, resists having a size of 48×68 mm☐ (MT-UV-5203 produced by Mitsui Chemical Co., Ltd.) were printed on the manganin plates, and the manganin plates were etched with a copper chloride solution to remove undesired portions of the manganin plates. Then, the resists were removed.

With respect to ten substrates thus obtained, the displacement fraction defective was measured on the basis of ±0.2 mm as a criterion, so that the displacement fraction defective was 0%.

EXAMPLE 2

An alumina substrate having a size of 60×80 mm☐ and a thickness of 0.635 mm was prepared, and a break line processing was carried out so as to separate the alumina substrate into 35 regions, each having a size of 10×10 mm☐, while ensuring a dummy portion of 5 mm in the edge portion thereof. Thereafter, plates of a Cu—Ni—Mn alloy (manganin) having a size of 56×75 mm☐ and a thickness of 0.2 mm and serving as a resistive alloy were arranged directly on both sides of the alumina substrate to be heated in an atmosphere of nitrogen to a maximum temperature of 975° C. to obtain a metal/ceramic bonding article. Then, 35 resists, each having a size of 8×8 mm☐ (MT-UV-5203 produced by Mitsui Chemical Co., Ltd.), were printed on the manganin plates so that each of the resists corresponds to the center of each of the 35 regions of 10×10 mm☐ on the alumina substrate, and the manganin plates were etched with a copper chloride solution to remove undesired portions of the manganin plates. Then, the resists were removed.

The substrate thus obtained was divided into pieces, each having a size of 10×10 mm☐, and the displacement fraction defective of each piece was measured on the basis of ±0.2 mm as a criterion, so that the displacement fraction defective was 0%.

EXAMPLE 3

With respect to the metal/ceramic bonding article obtained by the same method as that in Example 2, the same etching process as that in Example 2 was carried out, and the resists were removed. Thereafter, the substrate thus obtained was dipped in a 10% solution of Enplate PC455 (Meltex Co., Ltd.) at 47° C. for 325 seconds to be degreased, and dipped in a solution of CPB50+35% $H_2O_2$ water (47%+4%) (Mitsubishi Gas Chemical Co., Inc.) at 45° C. for 70 seconds to be chemical-polished. Then, the substrate was dipped in sulfuric acid (10%) at room temperature for 30 seconds to be acid-pickled, and dipped in a 10% solution of Melplate Activator 350 (Meltex Co., Ltd.) at 30° C. for 220 seconds to carry out a catalyst application. Thereafter, the substrate was dipped in a solution of Nimuden SX-M+SX-A (10%+5.5%) (C. Uyemura & Co., Ltd.) at 84° C. for 8 minutes to carry out the electroless Ni—P plating on the entire surface of the manganin plates.

After the substrate thus obtained was divided into pieces, each having a size of 10×10 mm□, the appearance of each piece was checked with the naked eye. In addition, the plating wettability of each piece was evaluated, and a resistance between one side and the other side thereof, which will be hereinafter referred to as a "surface/reverse insulation resistance", was measured. As a result, the appearance and the plating wettability were good, and the surface/reverse insulation resistance was higher than 1000 MΩ.

EXAMPLE 4

An alumina substrate having a size of 60×80 mm□ and a thickness of 0.635 mm was prepared, and a break line processing was carried out so as to separate the alumina substrate into regions, each having a size of 10×10 mm□. Thereafter, a plate of a Cu—Ni—Mn alloy (manganin) having a size of 56×75 mm□ and a thickness of 0.1 mm and serving as a resistive alloy was arranged directly on one side of the alumina substrate, and a plate of a Cu—Ni—Mn alloy (manganin) having a size of 56×75 mm□ and a thickness of 0.05 mm and serving as a resistive alloy was arranged directly on the other side of the alumina substrate. Then, the substrate was heated in an atmosphere of nitrogen to a maximum temperature of 975° C. to obtain a metal/ceramic bonding article. Then, the same resists (MT-UV-5203 produced by Mitsui Chemical Co., Ltd.) as those in Example 2 were printed on the manganin plates, and the manganin plates were etched with a copper chloride solution to remove undesired portions of the manganin plates. Then, the resists were removed.

Then, the substrate thus obtained was dipped in a 10% solution of Enplate PC455 (Meltex Co., Ltd.) at 47° C. for 325 seconds to be degreased, and dipped in a solution of CPB50+35% $H_2O_2$ water (47%+4%) (Mitsubishi Gas Chemical Co., Inc.) at 45° C. for 70 seconds to be chemical-polished. Then, the substrate was dipped in sulfuric acid (10%) at room temperature for 30 seconds to be acid-pickled, and dipped in a 10% solution of Melplate Activator 350 (Meltex Co., Ltd.) at 30° C. for 220 seconds to carry out a catalyst application. Thereafter, the substrate was dipped in a solution of Nimuden SX-M+SX-A (10%+5.5%) (C. Uyemura & Co., Ltd.) at 84° C. for 8 minutes to carry out the electroless Ni—P plating on the entire surface of the manganin plates.

After the substrate thus obtained was divided into pieces, each having a size of 10×10 mm□, the appearance of each piece was checked with the naked eye. In addition, the plating wettability of each piece was evaluated, and the surface/reverse insulation resistance thereof and the 90° peel bonding strength of the manganin plate were measured. As a result, the appearance and the plating wettability were good, and the surface/reverse insulation resistance was higher than 1000 MΩ. In addition, the 90° peel bonding strength of the manganin plate on the one side was 60.1 N/cm, and the 90° peel bonding strength of the manganin plate on the other side was 41.0 N/cm.

EXAMPLE 5

An alumina substrate having a size of 60×80 mm□ and a thickness of 0.635 mm was prepared, and a break line processing was carried out so as to separate the alumina substrate into regions, each having a size of 10×10 mm□. Thereafter, plates of a Cu—Ni—Mn alloy (manganin) having a size of 56×75 mm□ and a thickness of 0.1 mm and serving as a resistive alloy were arranged directly on both sides of the alumina substrate to be heated in an atmosphere of nitrogen to a maximum temperature of 975° C. to obtain a metal/ceramic bonding article. Then, the same resists (MT-UV-5203 produced by Mitsui Chemical Co., Ltd.) as those in Example 2 were printed on the manganin plates, and the manganin plates were etched with a copper chloride solution to remove undesired portions of the manganin plates. Then, the resists were removed.

Then, the substrate thus obtained was dipped in a 10% solution of Enplate PC455 (Meltex Co., Ltd.) at 47° C. for 325 seconds to be degreased, and dipped in a solution of CPB50+35% $H_2O_2$ water (47%+4%) (Mitsubishi Gas Chemical Co., Inc.) at 45° C. for 70 seconds to be chemical-polished. Then, the substrate was dipped in sulfuric acid (10%) at room temperature for 30 seconds to be acid-pickled, and dipped in a 10% solution of Melplate Activator 350 (Meltex Co., Ltd.) at 30° C. for 220 seconds to carry out a catalyst application. Thereafter, the substrate was dipped in a solution of Nimuden SX-M+SX-A (10%+5.5%) (C. Uyemura & Co., Ltd.) at 84° C. for 8 minutes to carry out the electroless Ni—P plating on the entire surface of the manganin plates.

After the substrate thus obtained was divided into pieces, each having a size of 10×10 mm□, the appearance of each piece was checked with the naked eye. In addition, the plating wettability of each piece was evaluated, and the surface/reverse insulation resistance thereof and the 90° peel bonding strength of the manganin plate were measured. As a result, the appearance and the plating wettability were good, and the surface/reverse insulation resistance was higher than 1000 MΩ. In addition, the 90° peel bonding strength of the manganin plate was 60.1 N/cm.

EXAMPLE 6

An alumina substrate having a size of 60×80 mm□ and a thickness of 0.635 mm was prepared, and a break line processing was carried out so as to separate the alumina substrate into regions, each having a size of 10×10 mm□. Thereafter, plates of a Cu—Ni—Mn alloy (manganin) having a size of 56×75 mm□ and a thickness of 0.2 mm and serving as a resistive alloy were arranged directly on both sides of the alumina substrate to be heated in an atmosphere of nitrogen to a maximum temperature of 975° C. to obtain a metal/ceramic bonding article. Then, the same resists (MT-UV-5203 produced by Mitsui Chemical Co., Ltd.) as those in Example 2 were printed on the manganin plates, and the manganin plates were etched with a copper chloride solution to remove undesired portions of the manganin plates. Then, the resists were removed.

Then, plating resists (MT-UV-5203 produced by Mitsui Chemical Co., Ltd.) were printed on predetermined portions of the manganin plates. Thereafter, the substrate thus obtained was dipped in a 10% solution of Enplate PC455 (Meltex Co., Ltd.) at 47° C. for 325 seconds to be degreased, and dipped in a solution of CPB50+35% $H_2O_2$ water (47%+4%) (Mitsubishi Gas Chemical Co., Inc.) at 45° C. for 70 seconds to be chemical-polished. Then, the substrate was dipped in sulfuric acid (10%) at room temperature for 30 seconds to be acid-pickled, and dipped in a 10% solution of Melplate Activator 350 (Meltex Co., Ltd.) at 30° C. for 110 seconds to carry out a catalyst application. Thereafter, the substrate was dipped in a solution of Nimuden SX-M+SX-A (10%+5.5%) (C. Uyemura & Co., Ltd.) at 84° C. for 8 minutes to carry out the electroless Ni—P plating on the predetermined portions of the manganin plates. Then, the plating resists were removed.

After the substrate thus obtained was divided into pieces, each having a size of 10×10 mm□, the appearance of each piece was checked with the naked eye. In addition, the plating wettability and partial plating performance of each piece were evaluated, and the surface/reverse insulation resistance thereof was measured. As a result, the appearance, plating wettability and partial plating performance were good, and the surface/reverse insulation resistance was higher than 1000 M$\Omega$.

As described above, according to the present invention, it is possible to provide a metal/ceramic bonding article capable of reducing the displacement failure of parts to improve productivity and capable of preventing bonding failure during the mounting of a semiconductor device or the like thereon, and a method for producing the same.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing a metal/ceramic bonding article, said method comprising the steps of:

arranging a metal plate of an alloy containing copper and nickel on a ceramic substrate;

heating said metal plate and said ceramic substrate at a temperature approximating a melting point of the alloy in an atmosphere of an inert gas or in vacuo to bond said metal plate directly to said ceramic substrate;

applying a resist on a predetermined portion of said metal plate bonded directly to said ceramic substrate;

removing an undesired portion of said metal plate by etching; and removing said resist to form a pattern having a predetermined shape of said alloy on said ceramic substrate.

2. A method for producing a metal/ceramic bonding article as set forth in claim 1, wherein said alloy contains manganese.

3. A method for producing a metal/ceramic bonding article as set forth in claim 1, wherein said metal plate is made of an electric resistance material.

4. A method for producing a metal/ceramic bonding article as set forth in claim 1, wherein said etching is carried out by using an etchant containing copper chloride or iron chloride.

5. A method for producing a metal/ceramic bonding article as set forth in claim 1, wherein a plating is carried out on the entire surface or part of said metal plate.

6. A method for producing a metal/ceramic bonding article as set forth in claim 5, wherein said plating is Ni plating, Ni alloy plating or Au plating.

* * * * *